United States Patent [19]

Groenewegen

[11] Patent Number: 4,944,401
[45] Date of Patent: Jul. 31, 1990

[54] CRASH SURVIVABLE ENCLOSURE FOR FLIGHT RECORDER

[75] Inventor: Johannes B. Groenewegen, Kirkland, Wash.

[73] Assignee: Sundstrand Data Control, Inc., Redmond, Wash.

[21] Appl. No.: 413,805

[22] Filed: Sep. 28, 1989

[51] Int. Cl.$^5$ .................... B65D 81/02; B65D 85/30
[52] U.S. Cl. ............................ 206/521; 206/305;
206/334; 206/525; 206/811; 174/52.2; 244/1 R;
455/96; 455/98; 220/452; 220/429; 220/468;
220/88 R
[58] Field of Search .............. 174/52.2; 244/1 R, 138;
455/96, 98; 220/88 R, 452, 429, 468, 469;
206/521, 305, 334, 811, 525

[56] References Cited

U.S. PATENT DOCUMENTS

| 2,959,671 | 11/1960 | Stevinson | 244/1 R |
| 3,140,847 | 7/1964 | Ames, Jr. | 244/1 R |
| 3,181,809 | 5/1965 | Lobelle | 244/1 R |
| 3,583,657 | 6/1971 | Boyce | 244/1 R |
| 3,978,410 | 8/1976 | Fletcher et al. | 455/96 |
| 4,694,119 | 9/1987 | Groenewegen | 174/52.2 |
| 4,721,227 | 1/1988 | Hughes et al. | 220/469 X |

FOREIGN PATENT DOCUMENTS

| 3243495 | 5/1984 | Fed. Rep. of Germany | 220/3.1 |
| 2588993 | 4/1987 | France | 206/521 |
| 2128128 | 4/1984 | United Kingdom | 206/521 |

Primary Examiner—William I. Price
Attorney, Agent, or Firm—Michael S. Yatsko; Trevor B. Joike

[57] ABSTRACT

A crash survivable enclosure for flight data recorders used in aircraft and other vehicles operating over land and water includes a strong, light-weight metal shell for enclosing and protecting an information storage device having power, signal, and address lines connected thereto. The memory device is supported inside the shell in a wax filler of the type having a high melting temperature and a high heat of fusion to act as a heat sink for absorbing a large quantity of heat to minimize possible damage to the memory device because of excessive heat, flames and/or high temperature. A strong lightweight metal shell is provided to enclose and protect the inner shell and contents against substantial, external mechanical forces commonly occurring in a crash and flames, heat and fire resulting therefrom. A second filler of high efficiency, heat insulating material is provided for physically supporting the inner shell and contents and for providing protection against flame, fire and heat penetration as well as physical impact and shock penetration as would be encountered in a crash of an aircraft or other vehicle carrying the enclosure. The enclosure is especially designed to withstand prolonged immersion in salt water at substantial depths to provide protection against damage to the memory device so that pertinent recorded information is available upon retrieval of the enclosure after a crash.

68 Claims, 3 Drawing Sheets

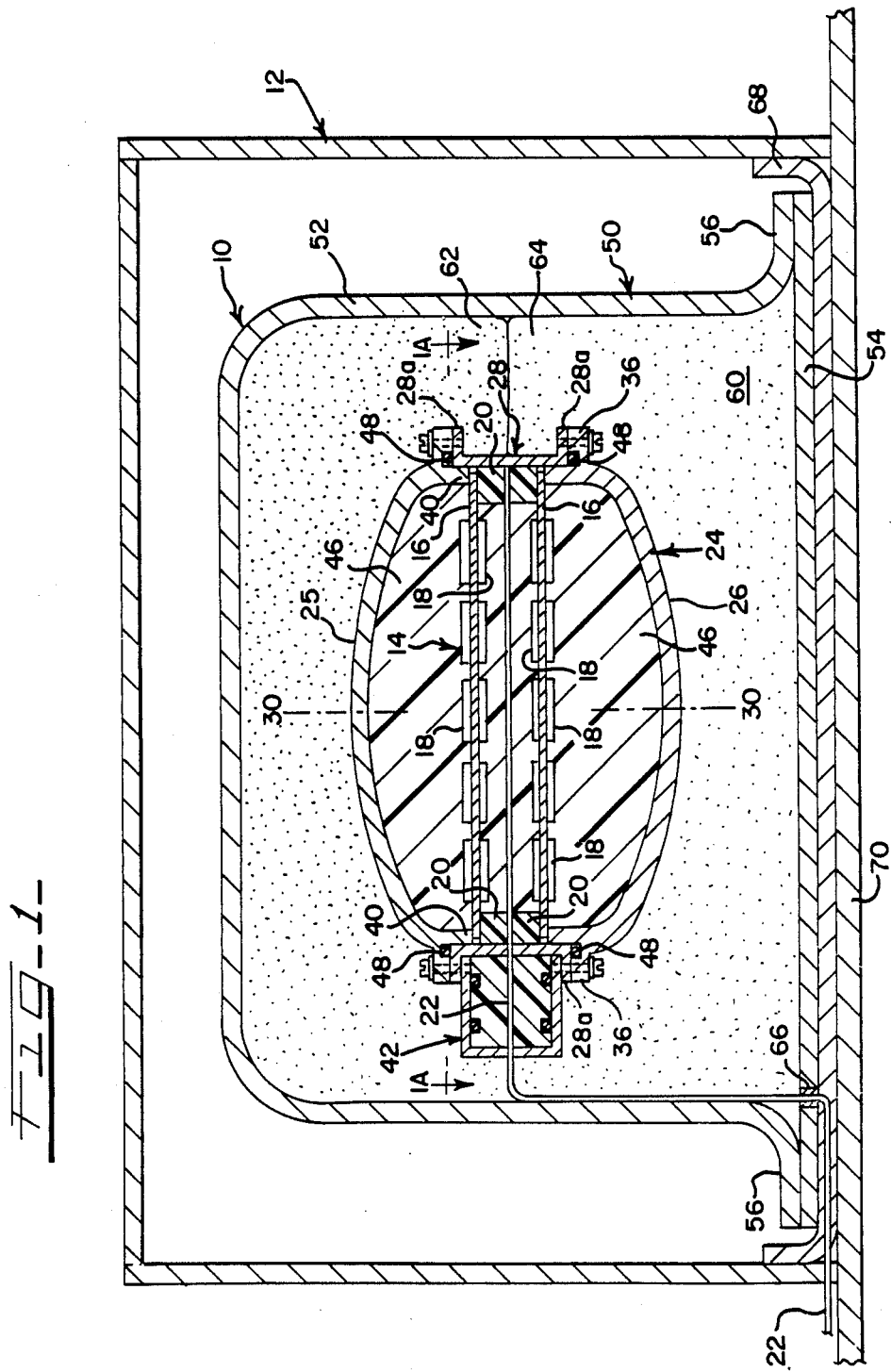

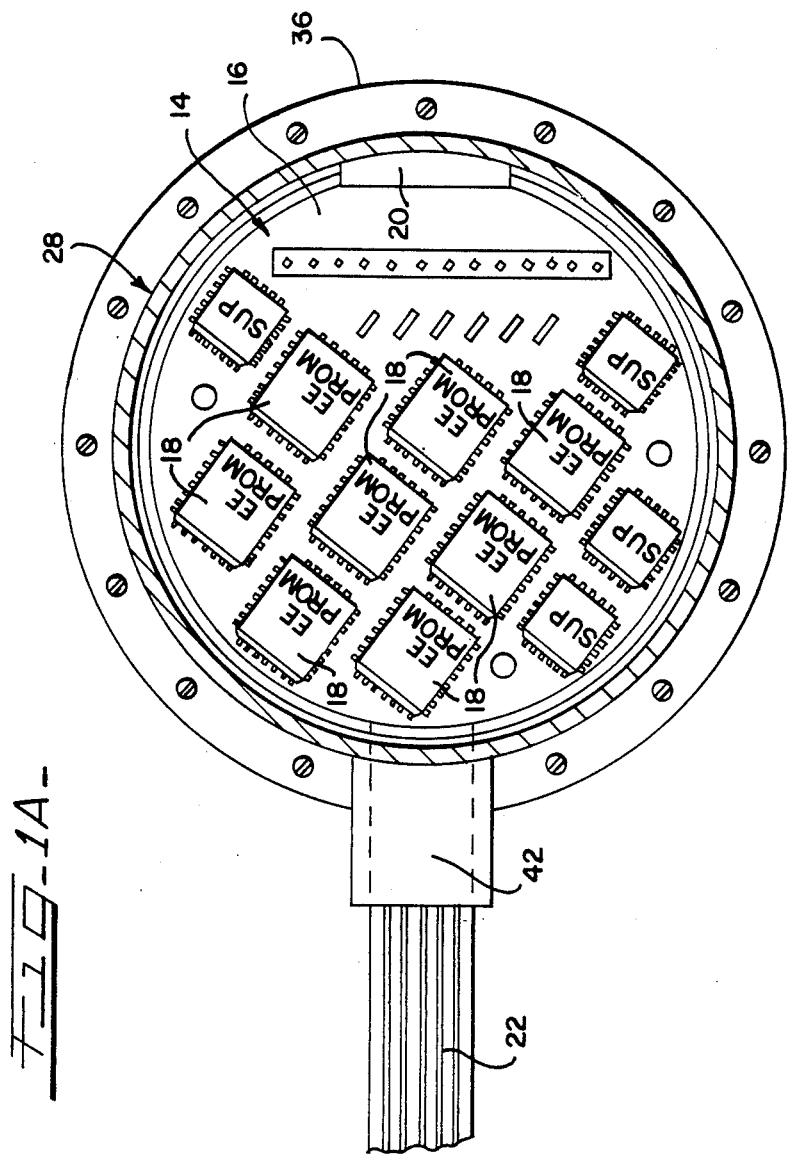
FIG-1A-

4,944,401

CRASH SURVIVABLE ENCLOSURE FOR FLIGHT RECORDER

BACKGROUND OF THE INVENTION

1. Field of the Invention

The present invention relates to crash survivable enclosures for flight recorders used in aircraft and other vehicles operating over land and water. More particularly, the invention is directed toward a crash survivable enclosure which is capable of withstanding high impact, shock and mechanical penetration forces that commonly occur in a crash and the high temperatures, flames and heat that often develop after a crash. In addition, the enclosure is specially designed for resisting damage to solid state memory devices contained therein, even if the enclosure subjected to immersion in fresh water or salt water to a depth of up to 20,000 feet for a prolonged period of thirty days or more.

2. Description of the Prior Art

Solid state memory devices have been used in flight recorders for recording essential flight data or information useful in determining causes of crashes or other mishaps in aircraft and other vehicles. When a crash occurs, it is essential that the recorded information on board survive the crash and subsequent events including heat, cold, flame and fire that may afterwards ensue. In addition, should the crash or impact occur over the ocean or another body of water, it is essential that the crash survivable portion of the flight data recorder remain intact for a prolonged period of time, even though the enclosure is submerged to a substantial depth in sea water or fresh water until the recorder is eventually located and retrieved for examination of the data contained in the solid state memory devices thereof.

U.S. Pat. No. 2,328,208 discloses an ejectable package containing a device for recording information and indicating location of a fallen airplane. The ejectable package includes a container for a recording instrument, a parachute and a smoke bomb which is activated to signal the aircraft location after a crash and the container is designed to float upon a body of water.

U.S. Pat. No. 2,959,671 discloses a crash position indicator which forms part of the aerodynamic surface of a rear portion of an aircraft and which contains a radio beacon mounted in a tumbling airfoil shape which is separated from the aircraft fuselage and is shaped to minimize damage and preserve recorded information contained therein.

U.S. Pat. No. 3,140,847 discloses an ejectable flight recorder including a capsule and means for ejecting the capsule automatically with a parachute automatically being employed to slow the descent of the ejected capsule to minimize damage thereto. The capsule can be automatically ejected with explosive force after an aerospace vehicle has hit the ground.

U.S. Pat. No. 3,181,809 discloses an aircraft crash recording unit housed within a canister which is ejected from the aircraft and includes a parachute and a flotation bag for preventing the canister from sinking in the water.

U.S. Pat. No. 3,583,657 discloses an apparatus for the underwater ejection of a buoyant aircraft flight recorder in a crash proof container. The apparatus operates in response to a pressure sensor and allows the crash protected enclosure to escape from a water immersion depth of 25 to 35 feet to move upwardly and float on the surface.

U.S. Pat. No. 3,978,410 discloses an aircraft mounted crash activated transmitter device which is automatically ejected from the aircraft and which includes a foam filled outer circular case which is designed to withstand certain "G" loading.

U.S. Pat. No. 4,694,119 discloses a heat shielded memory unit for an aircraft flight data recorder employing thermal insulation to prevent the loss of data if the aircraft burns.

OBJECTS OF THE INVENTION

It is an object of the present invention to provide a new and improved crash survivable enclosure for flight recorders used in aerospace vehicles operating over land and water, and more particularly, it is an object of the present invention to provide a crash survivable enclosure of the character described which is capable of surviving high impact force and high penetration forces that are commonly encountered in an aircraft crash.

It is another object of the present invention to provide a new and improved crash survivable enclosure of the type described which is capable of withstanding fire, flame and high temperatures that may result after a crash, and in addition, to provide an enclosure that is capable of surviving prolonged immersion in salt water without material damage to a memory device for storing flight data that is contained therein.

More particularly, it is an object of the present invention to provide a new and improved crash survivable enclosure of the character described which is capable of withstanding the intense pressure of up to 8,660 psi encountered because of immersion in salt water or fresh water to depths of 20,000 feet for a period of up to thirty days.

Yet another object of the present invention is to provide a new and improved crash survivable enclosure of the character described which fully meets or exceeds all of the requirements set forth in Technical Standard Order, (TSO C-51a), future TSO C-124 issued by the Federal Aviation Administration (FAA), and EURO-CAE MOPR ED-55 and in addition, an enclosure capable of withstanding the high pressure and corrosive action caused by immersion in salt water to a depth of 20,000 feet for a period of thirty days.

Another object of the present invention is to provide a new and improved protective enclosure which is of a lightweight design and which is relatively small in size (mountable in a ½ ATR size, standard electronics enclosure), and which is compatible with aircraft recorder requirements and capable of protecting a solid state or other memory device therein from the effects caused by immersion in sea water at depths of up to 20,000 feet for a period of thirty days.

Yet another object of the present invention is to provide a new and improved, high strength, lightweight, crash survivable enclosure for flight data recorders having one or more protective metal shells formed of high strength, lightweight materials such as titanium alloys and/or stainless steel alloys.

Still another object of the present invention is to provide a new and improved crash survivable enclosure of the character described in the foregoing object which includes a synthetic wax filler having a high melting temperature and a high latent heat of fusion to act as a heat sink for preventing the loss or damage to data stored in a solid state flight data recorder because of excessive heat, temperature and flame.

Still another object of the present invention is to provide a new and improved crash survivable enclosure of the character described which includes a highly efficient, solid state heat insulating filler within a high strength metal shell for minimizing the transfer of heat into a flight data recorder contained within the shell.

Another object of the present invention is to provide a new and improved crash survivable enclosure for flight recorders which is relatively low in cost, extremely reliable in operation and which meets all applicable FAA Technical Standard Order requirements as well as the requirements for flight data recorder enclosures as promulgated by SAE Committees and by the European Civil Aeronautics Committees.

Still another object of the present invention is to provide a new and improved crash survivable enclosure for solid state flight data recorders which is small enough in size to fit into a standard ½ ATR size, standard electronics enclosure.

BRIEF SUMMARY OF THE INVENTION

The foregoing and other objects and advantages of the present invention are accomplished in illustrative embodiments thereof comprising a new and improved crash survivable enclosure for flight data recorders used in aircraft, spacecraft and other vehicles operating over both land and water. The enclosure includes a strong, lightweight metal shell for enclosing and protecting an information storage device such as a solid state memory or magnetic memory having power, signal and address lines connected therewith. The shell is formed with a convex outer surface to provide high strength to resist the crushing effect of high pressure water which is encountered when the enclosure is submerged at a substantial depth (20,000 feet below sea level) for a prolonged period of time (thirty days). A solid filler of synthetic wax having a high melting temperature and a high latent heat of fusion is provided around the solid state memory device.

An outer protective shell of lightweight, high strength metals such as titanium alloys and/or stainless steel alloys may be provided for enclosing and protecting the inner shell and contents against both mechanical forces and fire, heat and flames.

A second filler of solid state, high efficiency, high temperature resistant, heat insulating material is provided around the flight data recorder and wax filler to further provide protection against fire, flame and heat penetration.

The light-in-weight, but extremely strong metal shells provide physical strength for resisting impact shocks ranging from 3400 G's lasting for 6.5 milliseconds to 1000 G's lasting for 15 milliseconds, acting on the orthogonal axes of the shells. The fillers provide protection against heat and flame and penetration while physically supporting the components in a spaced apart relation within the shell to reduce impact shock forces and penetration damage possibilities. The crash survivable enclosure in accordance with the present invention, meets and exceeds all requirements under present TSO C-51a, future TSO C-124 and EUROCAE MOPR ED-55.

In accordance with the invention, the new and improved enclosure provides protection for the solid state memory devices of the flight data recorder against penetration, corrosion and damage from fresh water and/or sea water occasioned by the immersion to a depth of 20,000 feet for a prolonged period of approximately thirty days. This protection is provided by the shell(s) and the fillers and enables an enclosure lost in a crash at sea to be retrieved after a considerable period of time has elapsed after the occurrence of a crash without substantial damage or loss of the data or information contained in the solid state memory device, even though the enclosure is submerged at a depth of 20,000 feet for a period of thirty days.

BRIEF DESCRIPTION OF THE DRAWINGS

For a better understanding of the present invention, reference should be had to the following detailed description taken in conjunction with the drawings, in which:

FIG. 1 is a cross-sectional view of a new and improved crash survivable enclosure for a flight recorder constructed in accordance with the present invention and shown while mounted within a ½ ATR size electronic box;

FIG. 1A is a cross-sectional view taken substantially along lines 1A—1A of FIG. 1;

DESCRIPTION OF PREFERRED EMBODIMENTS OF THE PRESENT INVENTION

Figure 2:
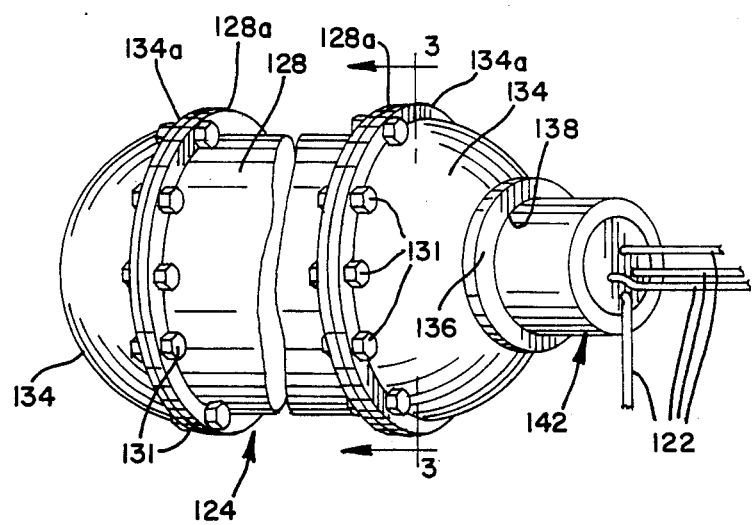
FIG. 2 is a perspective, elevational view of another embodiment of a crash survivable enclosure for flight recorders constructed in accordance with the present invention.

Referring now more particularly to the drawings, therein is illustrated a new and improved crash survivable enclosure 10 for flight data recorders used in aircraft or other vehicles operating over land and water. The enclosure 10 is relatively small in size, light in weight and as illustrated in FIG. 1, is designed to be accommodated and contained within a ½ ATR size, standard electronic enclosure 12 of the type specified for mounting in electronic support racks commonly provided in aircraft.

The crash survivable protective enclosure 10 is specifically designed to protect flight data information stored in a solid state memory 14 from physical damage resulting from the crash of an aircraft or other vehicle so that such data or information may be retrieved at a later time and used for the purposes of determining the cause of the crash. Typically, a flight data recorder 14 may include a plurality of circuit boards 16 having several banks of memory devices 18 mounted on opposite sides thereof and interconnected by a plurality of PCB connectors 20 to power, signal and address lines 22 which pass outwardly of the enclosure 10 for interconnection to various systems of an aircraft or other vehicle as known in the art.

In accordance with the present invention, the solid state memory 14 is supported and protected within a hollow, tubular inner shell or enclosure 24 formed of lightweight, high strength metal such as titanium alloys and/or stainless steel alloys. The inner shell 24 has a pair of upper and lower, outwardly convex, halves 25 and 26 which are generally circular or round in transverse cross-section. As illustrated in FIGS. 1 and 1A, the shell 24 includes a cylindrical, central or middle portion 28 coaxially aligned with respect to a central axis 30. The cup or dome-shaped upper and lower halves 25 and 26 have concentric, cylindrically-shaped, inner annular ring flanges 40 for receiving upper and lower edge flanges 28a respectively, of the cylindrical center ring 28.

The annular center ring 28 includes a slot or opening abutting one or more general cylindrically-shaped, sealed feed-through 42 units mounted at selected radial orientation around the shell 24. When only one feed-through unit 42 is needed, only a single slot is formed in the central ring 28 and the inner shell 24 and its contents are sealed off tightly against the entry of fresh water and/or sea water, even at high pressures of up to 8,660 psi (equivalent to a 20,000 foot depth of sea water) so that the solid state memory devices 14 within the inner shell 24 are well protected and remain intact.

The shell 24 may be formed in a variety of different methods such as by casting, forging, metal spinning, etc., and the wall thickness of the shell is chosen so as to provide the necessary strength against crushing under the effect of the intense high pressure of up to 8,660 psi when submerged in sea water to depths of 20,000 feet. The generally outward convex truncated football shape of the shell 24 provides excellent strength for resisting high value crushing forces and the metals chosen for the shell are well adapted to resist the highly corrosive effects of sea water over a long period of time so that the internal solid state memory device 14 will remain intact and the recorded flight data will be preserved. Titanium alloys 15-3-3-3 and 10-2-3, and 17-7 type stainless steel alloys are among the suitable lightweight, high strength metals that are useful in shell construction.

In accordance with the present invention, the solid state memory devices 14 are physically supported and protected within the metal shell 24 by means of a solid, synthetic wax filler 46 which is introduced into the shell in a softened state (a buttery type consistency at about 150° C.) to subsequently completely solidify around the solid state memory devices 14 and nearly completely fill the inner shell 24. The synthetic wax material has a relatively high melting temperature, for example, approximately 193° C. and also has a very high latent heat of fusion so that the volume of wax material 46 within the shell 24 acts as a heat sink to absorb a relatively high quantity of heat energy and thus protects the solid state memory devices 14 from damage because of excessive heat or temperature. The synthetic wax material 46 also helps to protect the flight data memory 14 from damage caused by physical forces applied externally of the enclosure 10 during a crash.

A suitable synthetic wax filler 46 for use in the present invention is manufactured and sold under the tradename ACRAWAX HM-23. This material has a melting temperature of approximately 193° C., a high latent heat of fusion, a specific gravity of approximately 0.97, and a specific heat of approximately 0.50 BTU per pound. Other types of synthetic wax materials may also be utilized for providing heat protection and for physically supporting the solid state memory device 14 within the protective inner shell 24. Synthetic waxes having a melting temperature ranging from 143° C. to over 193° C. are useful in the shell 24 of the present invention for prevention of heat damage.

Suitable high pressure bulkhead-type, cylindrical feed-through units 42 can be obtained from the Douglas Engineering Company of Rockaway, N.J. These sealed feed-through units 42 are engineered to be capable of withstanding salt water at a pressure of 8,660 psi without leakage around the power, signal and address lines 22 extending axially therethrough for connection with the solid state memory device 14 within the shell 24.

In accordance with the present invention, the synthetic wax filler 46 is introduced into the metal shell to nearly completely fill the volume or space surrounding the solid-state memory device 14, the leads 20 and the lines 22. The filler also mechanically supports the solid-state memory device 14 and connections within the shell 24 against physical shock and damage. In addition, the synthetic wax filler 46 has a very high latent heat of fusion and acts as a heat sink for absorbing relatively large quantities of heat before rising above the melting temperature thereof. Even though a large quantity of heat could eventually enter through the shell wall in an intensely hot fire as sometimes occurs after the crash of an aircraft or other vehicle, the temperature is maintained at or below the melting temperature of the filler 46 until all of the wax is melted which is a very unlikely event. Absorption of this heat by the wax filler 46 protects the solid-state memory device 14 against damage from excessive heat, flames and temperature so that previously recorded flight data information is available when the enclosure 10 and contents are recovered after an aircraft accident After filling of the metal shell 24 with synthetic wax 46 in a softened or buttery consistency at about 150° C., the wax is allowed to solidify into solid form and thereafter the sealed feed-through units 42 are inserted into place between the flanges 28a of the ring 28 as shown in FIGS. 1 and 1A and are secured in a suitable manner such as bonding. High pressure O-rings 48 may be provided in the flanges of the shell halves 25 and 26 to establish high pressure seals against the flanges 28a. The seals are capable of withstanding (without significant leakage), sea water and/or fresh water pressures in the range of 8,660 psi, which pressures are encountered at depths of submergence up to 20,000 feet.

The metal shell 24, the enclosed solid-state memory 14 and the synthetic wax filler 46 are physically supported and protected within an outer metal shell 50 having a cup-shaped upper portion 52 joined to and closed with a flat bottom wall 54 around a peripheral flange 56. Preferably, the outer metal shell 50 is also formed of strong, lightweight metal such as titanium, titanium alloys and/or stainless steels and has a wall thickness suitable for providing protection or resistance to penetration forces equivalent to a 500 pound steel bar dropped from a height of 10 feet to strike a wall of the outer shell 50 at a point of contact having an area no greater than 0.05 square inches. High pressure submergence in sea water up to 20,000 feet. The shells 24 and 50 may have wall thicknesses varying from ⅛" to ¼" depending on the size and shape of the enclosure. The outer shell 50 is designed to provide protection for its contents against physical impact shock forces ranging in magnitude from 1,000 G's applied for 15 milliseconds to 3400 G's applied for 6.5 milliseconds. The inner shell 24 protects the memory device 14 from seawater crushing forces, penetration forces and provides a portion of the protection against fire, flames and heat or cold.

After such impact testing, the solid-state memory device 14 must still be in a condition capable of providing retrievable flight information data without substantial damage or distortion thereof. These requirements on force penetration and impact shock resistance are presently required in TSO C51a and future TSO C-124 of the FAA and by EUROCAE MOPR ED-55 as necessary in order to preserve recorded flight data information in a typical solid state memory device 14. The outer enclosure or shell 50 also provides protection against fire and heat penetration and is capable of keeping the solid state memory devices 14 intact for information retrieval even after the outer shell is subjected to flames at 1,100° C. enveloping the entire outside surface area for a minimum of thirty minutes or longer.

In order to facilitate the physical support of the metal shell 24 and its contents within the outer shell 50, and to further provide for physical protection and fire protection, the volume or space within the outer metal shell 50 surrounding the inner metal shell 24 is completely filled with a solid fibrous or particuate type of highly efficient, heat insulating material 60, preferably in the physical form of small microspheres. A suitable highly efficient and physically strong, solid particulate type of heat insulating filler material 60 is manufactured by the Micropore Insulation Ltd., Company and sold under the tradename "MICROTHERM". This material has a very high resistivity to the transfer of heat therethrough and in addition, is capable of withstanding flame temperatures of 1,100° C. without substantial deterioration, burning or oxidization.

For example, at 1,100° C., one type of "MICROTHERM" heat insulating filler 60 transfers 0.27 BTUs per square foot of area, per inch of insulation thickness, per ° F. of temperature differential between the outer shell 50 and the inner shell 24. At lower temperatures in the range of approximately 170° C., the filler 60 will have a K factor of 0.146 BTU per square foot, per inch thickness, per degree farenheit.

The heat insulating filler 60 is tightly compacted and shaped into upper and lower half sections 62 and 64 and each half section has a recess which is sized to accommodate a symmetrical half portion of the inner metal shell 24 and sealed feed-through unit 42 so that the access, power, and address lines 22 may pass out along the longitudinal axis 30 of the solid-state memory device 14 and the surrounding inner metal shell 24.

The electrical lines 22 are directed out of the bottom wall 54 of the outer shell 50 through a suitable grommet 66 and pass through a slot formed in a supporting tray 68 mounted on a bottom wall 70 of the ½ ATR size electronics box 12 in which the crash survivable enclosure 10 is mounted.

The enclosure 10 is capable of meeting all of the present requirements mandated by TSO C51a promulgated by the FAA and European counterparts and, in addition, the inner shell 24 provides protection against prolonged submergence for at least thirty days in sea water to a depth of 20,000 feet. This depth of water develops hydraulic pressures of approximately 8,660 psi and the titanium alloy and/or stainless steel shells 24 and 50 in addition provide excellent protection against the other mechanical forces normally expected and encountered in the crash or destruction of an aircraft or other vehicle Moreover, the enclosure 10 provides protection against intense heat, flames, fire and/or oxidization which attends most aerospace vehicle crashes Importantly, the novel enclosure 10 and particularly the inner shell 24 provide protection for a long period of time (30 days) against the high pressure action of fresh water or sea water in which the enclosure may be immersed to depths of up to 20,000 feet.

Figure 3:
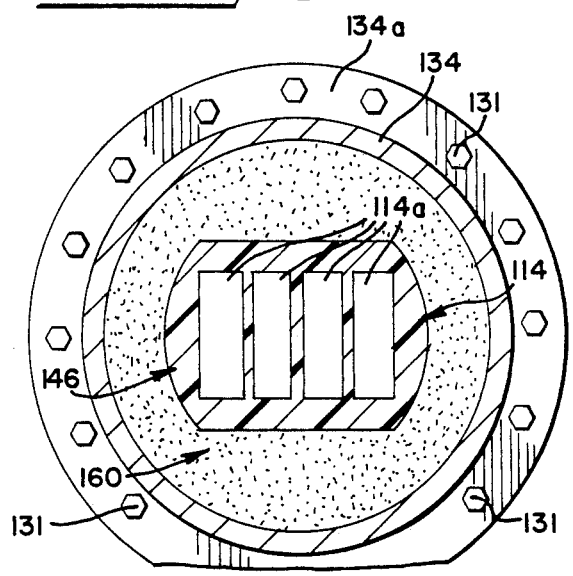
FIG. 3 is a transverse, cross-sectional view taken substantially along lines 3—3 of FIG. 2.

Referring now to FIGS. 2 and 3, therein is illustrated another embodiment of a crash survivable enclosure 110 having a single modified form of metal shell 124 constructed in accordance with the features of the present invention and adapted to surround and protect a solid-state magnetic memory device 114 of a flight data recorder. Typically, a flight data recorder may comprise a total of 32 electrically eraseable, programmable, read only memory devices (EEPROM) and supporting chips mounted on four separate circuit boards (CB) 114a, each CB comprising a standard electronics memory module. At one or both ends, the inner shell 124 is provided with a cylindrically-shaped, sealed feed-through element 142 to provide a water tight entry for power, signal and address lines 122 which project into the metal shell 124 and are connected to the solid-state flight data recorder 114 housed therein. As in the previously described embodiment, the metal shell 124 is filled with a first layer of solid synthetic wax material 146 having a high melting temperature and a high latent heat of fusion in order to provide a heat sink for absorbing heat to protect the solid-state memory device 114 from damage from heat or flames for a substantial period of time. Even at elevated temperatures, the wax will limit the internal temperature to 193° C. until all of the synthetic wax material 146 is melted into liquid form.

As illustrated in FIG. 3, the circuit board 114a of the memory device 114 are surrounded in a generally cylindrically-shaped mass of solid synthetic wax 146 which in turn, is supported and surrounded in a tubular shaped mass of highly efficient, solid-state, heat insulating filler 160 of a type similar to the filler 60 described in the foregoing embodiment. As previously indicated, the inner, solid-state synthetic wax filler 146 has a high latent heat of fusion and a high melting temperature to act as a heat sink for protecting the solid-state memory device 114 against damage from heat, flame and fire. In addition, the inner filler provides physical support for the memory device 114 and the circuit boards 114a. The outer, heat insulating solid filler 160 also provides physical support for the inner filler 146 and the solid-state memory device 114. In addition, the heat insulating filler 160 provides heat insulating protection to minimize heat transfer inwardly from an external fire or heat source outside of the shell 124 into the memory device 114.

In accordance with the present invention, the metal shell 124 is formed of titanium alloys and/or stainless steels, having a relatively high strength to weight ratio so as to provide protection against impact, shock, penetration forces, heat and fire, fully meeting the requirements of and in compliance with TSO C-51a as previously described. The shell 124 is formed in three separate pieces including a cylindrical, intermediate tubular section 128 having a circular cross-section and radial flanges 128a at opposite ends. The center or intermediate section 128 is connected to a pair of semispherically-shaped, outwardly convex, opposite end members 134 having radial annular flanges 134a of circular shape which are detachably secured to the end flanges 128a of the intermediate section 128 by a plurality of stainless steel or titanium alloy fasteners 131. One or both of the convex or dome-shaped, outer end members 134 are provided with a coaxially aligned, circular-shaped end wall 136 forming an end opening 138 and internal flange for receiving a sealed feed-through unit 142 or end closure plate as described in the previous embodiment.

The metal shell 124 provides protection against heat, flame, high temperature and has the necessary physical strength to protect the memory device 114 against damage from penetration forces and impact shock as in the prior embodiment. The metal shell 124 is designed to be capable of withstanding the extremely high pressures (8660 psi) caused by immersion in salt water to depths of up to 20,000 feet for prolonged periods of time (30 days) and the shell material and fasteners 131 resist the corrosive effects of salt water. Because the intermediate, cylindrical center section 128 and the opposite hemispherical end segments 134 are detachable from one another after loosening of the fasteners 131, the interior contents are readily or easily accessible when the enclosure 124 is retrieved after a crash. The wall thickness of the shell 124 is dimensioned in order to withstand the physical forces of a crash and the hydraulic forces of sea water at a depth of 20,000 feet and protects the solid state magnetic memory device 114 against damage therefrom.

Many modifications and variations of the present invention are possible in light of the above teachings. Thus, it is to be understood that, within the scope of the appended claims, the invention may be practiced otherwise than as specifically described above.

What is claimed and desired to be secured by Letters Patent of the United States is:

1. A crash survivable enclosure for flight recorders for aircraft, spacecraft and other vehicles operating over land and water, comprising:
   means including an inner shell for enclosing and protecting a memory device against the entry of water when submerged therein at a substantial depth for a prolonged period of time;
   first filler means for supporting said solid state memory device within said inner shell;
   means including an outer shell for enclosing and protecting said inner shell and contents against substantial mechanical forces and fire; and
   second filler means for supporting said inner shell and contents thereof in said outer shell and protecting against fire, flame and heat.

2. The crash survivable enclosure of claim 1, wherein:
   said inner shell is formed of a high-strength to weight ratio metal having a convex outer surface for resisting high pressure hydraulic forces resulting from immersion in water at a substantial depth.

3. The crash survivable enclosure of claim 1, wherein:
   said first filler means comprises a wax material having a high melting temperature and a high value latent heat of fusion to act as a heat sink for absorbing a substantial quantity of heat.

4. The crash survivable enclosure of claim 1, wherein:
   said outer shell is formed of a high-strength to weight ratio metal for resisting penetrative forces and impact shock forces.

5. The crash survivable enclosure of claim 1, wherein:
   said second filler means comprises a solid, heat insulating material having a high resistance to heat transfer between said inner and outer shells at elevated temperature levels.

6. The crash survivable enclosure of claim 5, wherein:
   said second filler means comprises a small size particulate or fibrous flame retardant material capable of withstanding temperatures in excess of 1100° C. without substantial oxidation thereof.

7. The crash survivable enclosure of claim 1, wherein:
   said inner shell is formed of titanium alloy.

8. The crash survivable enclosure of claim 1, wherein:
   said inner shell is formed of stainless steel alloy.

9. The crash survivable enclosure of claim 1, wherein:
   said first filler means comprises a wax introduced into said inner shell in a liquid state to surround said memory device and lines and support the same against movement relative to said inner shell after solidification of said wax from said liquid state to a solid state.

10. The crash survivable enclosure of claim 9, wherein:
    said first filler means comprises a wax which remains substantially in a solid state at temperatures in a range of approximately 143° C. to 193° C.

11. The crash survivable enclosure of claim 9, wherein:
    said first filler means comprises a wax having a specific heat of approximately 0.5 BTU per pound, per degree farenheit.

12. The crash survivable enclosure of claim 9, wherein:
    said first filler means comprises a wax having a specific gravity of approximately 0.97.

13. The crash survivable enclosure of claim 1, wherein:
    said outer shell is formed of a high-strength to weight ratio metal.

14. The crash survivable enclosure of claim 13, wherein:
    said outer shell is formed of a titanium alloy.

15. The crash survivable enclosure of claim 13, wherein:
    said outer shell is formed of a stainless steel alloy.

16. A crash survivable enclosure for flight recorders for vehicles capable of operating over land and water, comprising:
    means including a plurality of spaced apart metal shells for enclosing and protecting a memory device against damage from (a) submergence in water at a substantial depth for a prolonged period of time, (b) fire and heat at a temperature of at least 1100° C. enveloping 100% of the outside surface area of said shells for a minimum of 30 minutes, (c) impact shock of a magnitude of 1000 G's applied in each of the orthogonal axes for a time duration of at least 5 milliseconds, and (d) an external penetration impact force at least equal to that produced by a 500 lb. steel bar dropped from a height of 10 ft. to strike an outer one of said shells with a point of contact thereon having an area no greater than 0.05 square inches; and
    heat insulating filler means between said shells and between an inner one of said shells and said memory device for physically supporting said inner shell and solid state device in spaced apart physical and heat insulating relation.

17. The crash survivable enclosure of claim 16, wherein:
    said filler means includes a first filler for supporting said memory device within said inner shell and providing a heat sink for absorbing heat externally applied to said enclosure, and a second filler for supporting said inner shell inside an outer shell and having a low value of heat conductivity for minimizing heat transfer from said outer shell to said inner shell and contents therein.

18. A crash survivable enclosure for flight recorders for vehicles capable of operating over land and water, comprising:
    means including a plurality of spaced apart metal shells for enclosing and protecting a memory device against damage from (a) submergence in water at a substantial depth for a prolonged period of time, (b) fire and heat at a temperature of at least 1100° C. enveloping 100% of the outside surface area of said shells for a minimum of 30 minutes, (c) impact shock of a magnitude of 1000 G's applied in each of the orthogonal axes for a time duration of at least 5 milliseconds, and (d) an external penetration impact force at least equal to that produced by a 500 lb. steel bar dropped from a height of 10 ft. to strike an outer one of said shells with a point of contact thereon having an area no greater than 0.05 square inches; and heat insulating filler means between said shells and between an inner one of said shells and said memory device for physically supporting said inner shell and solid state device in spaced apart physical and heat insulating relation;

said filler means including a first filler for supporting said memory device within said inner shell and providing a heat sink for absorbing heat externally applied to said enclosure, and a second filler for supporting said inner shell inside an outer shell and having a low value of heat conductivity for minimizing heat transfer from said outer shell to said inner shell and contents therein;

said first filler comprising a synthetic wax introduced into said inner shell around said memory device while in a liquid form and solidified therein to substantially fill said inner shell around said memory device for supporting the same within said inner shell.

19. The crash survivable enclosure of claim 18, wherein:
said synthetic wax has a melting temperature of approximately 193° C.

20. The crash survivable enclosure of claim 17, wherein:
said second filler comprises a solid particulate heat insulating material having a relatively low factor of heat conductivity at elevated temperatures.

21. The crash survivable enclosure of claim 20, wherein:
said second filler has a K factor range from approximately 0.146 BTU per sq. ft. per inch thickness per ° C. at a temperature of 170° C. to 0.270 BTU per sq. ft. per inch thickness, per ° C. at a temperature of 1100° C.

22. The crash survivable enclosure of claim 20, wherein:
said second filler has a K factor of approximately 0.270 BTU per sq. ft. per inch thickness per ° C. at a temperature of approximately 1100° C.

23. A crash survivable enclosure for flight recorders for vehicles capable of operating over land and water, comprising:
means including a plurality of spaced apart metal shells for enclosing and protecting a memory device against damage from (a) submergence in water at a substantial depth for a prolonged period of time, (b) fire and heat at a temperature of at least 1100° C. enveloping 100% of the outside surface area of said shells for a minimum of 30 minutes, (c) impact shock of a magnitude of 1000 G's applied in each of the orthogonal axes for a time duration of at least 5 milliseconds, and (d) an external penetration impact force at least equal to that produced by a 500 lb. steel bar dropped from a height of 10 ft. to strike an outer one of said shells with a point of contact thereon having an area no greater than 0.05 square inches;

said plurality of shells including an inner shell for containing and protecting said solid state memory device surrounded by a spaced apart outer shell for containing and protecting said inner shell and contents, said inner shell having at least one wall portion having a convex outer surface with an access opening formed therein;

heat insulating filler means between said shells and between an inner one of said shells and said memory device for physically supporting said inner shell and solid state device in spaced apart physical and heat insulating relation; and a high pressure, sealed feed-through element mounted in said opening for sealing around electrical lines connected to said solid state memory device contained within said inner shell.

24. The crash survivable enclosure of claim 23, wherein:
said convex outer surface is generally symmetrical around an axis of generation and said access opening is in coaxial alignment with said convex outer surface.

25. The crash survivable enclosure of claim 24, wherein:
said access opening is defined by an inwardly extending annular radial flange; and
said sealed feed-through element has an inner end seated adjacent said radial flange.

26. A crash survivable enclosure for flight recorders for vehicles capable of operating over land and water, comprising:
means including a plurality of spaced apart metal shells for enclosing and protecting a memory device against damage from (a) submergence in water at a substantial depth for a prolonged period of time, (b) fire and heat at a temperature of at least 1100° C. enveloping 100% of the outside surface area of said shells for a minimum of 30 minutes, (c) impact shock of a magnitude of 1000 G's applied in each of the orthongonal axes for a time duration of at least 5 milliseconds, and (d) an external penetration impact force at least equal to that produced by a 500 lb. steel bar dropped from a height of 10 ft. to strike an outer one of said shells with a point of contact thereon having an area no greater than 0.05 square inches;

said inner shell comprising a hollow tubular body having an intermediate convex outer surface portion and opposite end portions in coaxial alignment with a central axis of said body tapering inwardly toward opposite outer ends; and heat insulating filler means between said shells and between an inner one of said shells and said memory device for physically supporting said inner shell and solid state device in spaced apart physical and heat insulating relation.

27. The crash survivable enclosure of claim 26, wherein:
said intermediate portion of said inner shell is generally cylindrical and said opposite end portions join opposite ends of said intermediate portion.

28. The crash survivable enclosure of claim 27, wherein:
said intermediate portion and said opposite end portions of said inner shell are integral.

29. The crash survivable enclosure of claim 26, wherein:
said intermediate portion and at least one of said end portions of said shell are detachably interconnected with one another.

30. The crash survivable enclosure of claim 29, wherein:
said intermediate portion and said one end portion of said shell include interfitting annular flanges forming a watertight joint when said intermediate portion and said one end portion are secured together.

31. A crash survivable enclosure for an information storage device, comprising:
filler means around said device for absorbing external heat employing the heat of fusion of a meltable filler and physically supporting said device; and
metal shell means around said filler means for protecting said device against external penetration and shock forces.

32. The crash survivable enclosure of claim 31, wherein:
said filler means includes a heat insulating filler in said shell means.

33. The crash survivable enclosure of claim 16, wherein:
said heat insulating filler means includes a meltable filler having a relatively high melting temperature.

34. The crash survivable enclosure of claim 33, including:
said heat insulating filler means includes said second filler positioned outside of said meltable filler for minimizing external heat penetration to the same.

35. The crash survivable enclosure of claim 31, wherein:
said metal shell means includes a plurality of spaced apart shells; and
at least a portion of said filler means is present between said shells.

36. The crash survivable enclosure of claim 35, wherein:
said filler means includes a heat insulating filler between said metal shells.

37. The crash survivable enclosure of claim 33, wherein:
said meltable filler is present between an inner one of said metal shells and said information storage device.

38. The crash survivable enclosure of claim 37, wherein:
said heat insulating filler is present between said inner shell and an outer shell.

39. The crash survivable enclosure of claim 32, wherein:
said heat insulating filler is present around said meltable filler.

40. The crash survivable enclosure of claim 39, wherein:
said shell means is in contact around an outer surface of said heat insulating filler.

41. A crash survivable enclosure for flight recorders for aircraft, spacecraft and other vehicles operating over land and water, comprising:
means including an inner shell for enclosing and protecting a memory device against the entry of water when submerged therein at a substantial depth for a prolonged period of time;
first filler means for supporting said memory device within said inner shell, said first filler means comprising a wax-like material having a high melting temperature and a high value latent heat of fusion to act as a heat sink for absorbing a substantial quantity of heat, said wax-like material being introduced into said inner shell in a softened condition to substantially fill the space in said inner shall around said memory device and thereafter solidified to physically support said memory device within said shell;
means including an outer shell for enclosing and protecting said inner shell and contents against substantial mechanical forces and fire; and
second filler means for supporting said inner shell and contents thereof in said outer shell and protecting against fire, flame and heat.

42. The crash survivable enclosure of claim 41, wherein:
said inner shell is formed of a high-strength to weight ratio metal having a convex outer surface for resisting high pressure hydraulic forces resulting from immersion in water at a substantial depth.

43. The crash survivable enclosure of claim 41, wherein:
said outer shell is formed of a high-strength to weight ratio metal for resisting penetrative forces and impact shock forces.

44. The crash survivable enclosure of claim 41, wherein:
said second filler means comprises a solid, heat insulating material having a high resistance to heat transfer between said inner and outer shells at elevated temperature levels.

45. The crash survivable enclosure of claim 44, wherein:
said second filler means comprises a small size particulate or fibrous flame retardant material capable of withstanding temperatures in excess of 1100° C. without substantial oxidation thereof.

46. The crash survivable enclosure of claim 41, wherein:
said inner shell is formed of titanium alloy.

47. The crash survivable enclosure of claim 41, wherein:
said inner shell is formed of stainless steel alloy.

48. The crash survivable enclosure of claim 41, wherein:
said first filler means comprises a wax introduced into said inner shell in a liquid state to surround said memory device and lines to support the same against movement relative to said inner shell after solidification of said wax from said liquid state to a solid state.

49. The crash survivable enclosure of claim 48, wherein:
said first filler means comprises a wax which remains substantially in a solid state at temperatures in a range of approximately 143° C. to 193° C.

50. The crash survivable enclosure of claim 48, wherein:
said first filler means comprises a wax having a specific heat of approximately 0.5 BTU per pound, per degree farenheit.

51. The crash survivable enclosure of claim 48, wherein:
said first filler means comprises a wax having a specific gravity of approximately 0.97.

52. The crash survivable enclosure of claim 41, wherein:

said outer shell is formed of a high-strength to weight ratio metal.

53. The crash survivable enclosure of claim 52, wherein:
said outer shell is formed of a titanium alloy.

54. The crash survivable enclosure of claim 52, wherein:
said outer shell is formed of a stainless steel alloy.

55. A crash survivable enclosure for flight recorders for vehicles capable of operating over land and water, comprising:
means including a plurality of spaced apart metal shells for enclosing and protecting a memory device against damage from (a) submergence in water at a substantial depth for a prolonged period of time, (b) fire and heat at a temperature of at least 1100° C. enveloping 100% of the outside surface area of said shells for a minimum of 30 minutes, (c) impact shock of a magnitude of 1000 G's applied in each of the orthongonal axes for a time duration of at least 5 milliseconds, and (d) an external penetration impact force at least equal to that produced by a 500 lb. steel bar dropped from a height of 10 ft. to strike an outer one of said shells with a point of contact thereon having an area no greater than 0.05 square inches;
heat insulating filler means between said shells and between an inner one of said shells and said memory device for physically supporting said inner shell and solid state device in spaced apart physical and heat insulating relation, said heat insulating filler means including a first filler for supporting said memory device within said inner shell and providing a heat sink for absorbing heat externally applied to said enclosure, and a second filler for supporting said inner shell inside an outer shell and having a low value of heat conductivity for minimizing heat transfer from said outer shell to said inner shell and contents therein; and wherein
said first filler means comprises a synthetic wax introduced into said inner shell around said memory device while in a softened state and thereafter solidified therein to substantially fill said inner shell around said memory device for supporting the same within said inner shell.

56. The crash survivable enclosure of claim 55, wherein:
said synthetic wax has a melting temperature of approximately 193° C.

57. The crash survivable enclosure of claim 55, wherein:
said second filler comprises a solid particulate heat insulating material having a relatively low factor of heat conductivity at elevated temperatures.

58. The crash survivable enclosure of claim 57, wherein:
said second filler has a K factor range from approximately 0.146 BTU per sq. ft. per inch thickness per °C. at a temperature of 170° C. to 0.270 BTU per sq. ft. per inch thickness, per °C. at a temperature of 1100° C.

59. The crash survivable enclosure of claim 57, wherein:
said second filler has a K factor of approximately 0.270 BTU per sq. ft. per inch thickness per °C. at a temperature of approximately 1100° C.

60. The crash survivable enclosure of claim 55, wherein:
said plurality of shells includes an inner shell for containing and protecting said solid state memory device surrounded by a spaced apart outer shell for containing and protecting said inner shell and contents, said inner shell having at least one wall portion having a convex outer surface with an access opening formed therein; and
a high pressure, sealed feed-through element mounted in said opening for sealing around electrical lines connected to said solid state memory device contained within said inner shell.

61. The crash survivable enclosure of claim 60, wherein:
said convex outer surface is generally symmetrical around an axis of generation and said access opening is in coaxial alignment with said convex outer surface.

62. The crash survivable enclosure of claim 61, wherein:
said access opening is defined by an inwardly extending annular radial flange; and
said sealed feed-through element has an inner end seated adjacent said radial flange.

63. The crash survivable enclosure of claim 55, wherein:
said inner shell comprises a hollow tubular body having an intermediate convex outer surface portion and opposite end portions in coaxial alignment with a central axis of said body tapering inwardly toward opposite outer ends.

64. The crash survivable enclosure of claim 63, wherein:
said intermediate portion of said inner shell is generally cylindrical and said opposite end portions join opposite ends of said intermediate portion.

65. The crash survivable enclosure of claim 64, wherein:
said intermediate portion and said opposite end portions of said inner shell are integral.

66. The crash survivable enclosure of claim 63, wherein:
said intermediate portion and at least one of said end portions of said shell are detachably interconnected with one another.

67. The crash survivable enclosure of claim 66, wherein:
said intermediate portion and said one end portion of said shell include interfitting annular flanges forming a watertight joint when said intermediate portion and said one end portion are secured together.

68. The crash survivable enclosure of claim 67, wherein:
said meltable filler is present between an inner one of said metal shells and said information storage device.

* * * * *